(12) United States Patent
Bartlett et al.

(10) Patent No.: US 6,232,841 B1
(45) Date of Patent: May 15, 2001

(54) INTEGRATED TUNABLE HIGH EFFICIENCY POWER AMPLIFIER

(75) Inventors: James L. Bartlett, Cedar Rapids, IA (US); Mau Chung F. Chang, Thousand Oaks, CA (US); Henry O. Marcy, 5th, Camarillo, CA (US); Kenneth D. Pedrotti, Thousand Oaks, CA (US); David R. Pehlke, Chapel Hill, NC (US); Charles W. Seabury, Calabasas, CA (US); Jun J. Yao; Deepak Mehrotra, both of Thousand Oaks, CA (US); J. L. Julian Tham, San Jose, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/346,097

(22) Filed: Jul. 1, 1999

(51) Int. Cl.[7] ....................................... H03F 3/04
(52) U.S. Cl. .................. 330/305; 330/302; 330/303; 330/306
(58) Field of Search ................. 330/302, 303, 330/305, 306

(56) References Cited

U.S. PATENT DOCUMENTS

| | | | |
|---|---|---|---|
| 3,919,656 | 11/1975 | Sokal et al. | 330/51 |
| 5,276,912 | * 1/1994 | Siwiak et al. | 330/284 |
| 5,578,976 | 11/1996 | Yao | 333/262 |
| 5,872,489 | 2/1999 | Chang et al. | 331/179 |
| 5,880,921 | 3/1999 | Tham et al. | 361/233 |
| 6,091,966 | * 7/2000 | Meadows | 330/124 R |

OTHER PUBLICATIONS

Alan B. Grebene, Micro–Linear Corporation, *Bipolar and MOS Analog Integrated Circuit Design*, John Wiley & Sons, pp. 54–120, (1984).

Cheng T. Wang, editor, Device Research Institute, *Introduction to Semiconductor Technology: GaAs and Related Compounds*, John Wiley & Sons, pp. 123–133, 187–195 and 422–433, (1990).

Yao et al, "A Surface Micromachined Miniature Switch For Telecommunications Applications With Signal Frequencies From DC Up To 4 GHZ", *Tech. Digest, Transducer–95*, Stockholm, Sweden, pp. 384–387, (Jun. 25–29, 1995).

* cited by examiner

Primary Examiner—Benny Lee
Assistant Examiner—Patricia T. Nguyen
(74) Attorney, Agent, or Firm—Koppel & Jacobs

(57) ABSTRACT

Power amplifiers having reactive networks (such as classes C, C–E, E and F) employ tunable reactive devices in their reactive networks, with the reactive devices respective reactance values capable of being adjusted by means of respective control signals. The tunable reactive devices are made from micro-electromechanical (MEM) devices capable of being integrated with the control circuitry needed to produce the control signals and other amplifier components on a common substrate. The reactive components have high Q values across their adjustment range, enabling the amplifier to produce an output with a low harmonic content over a wide range of input signal frequencies, and a frequency agile, high quality output. The invention can be realized on a number of foundry technologies.

26 Claims, 14 Drawing Sheets

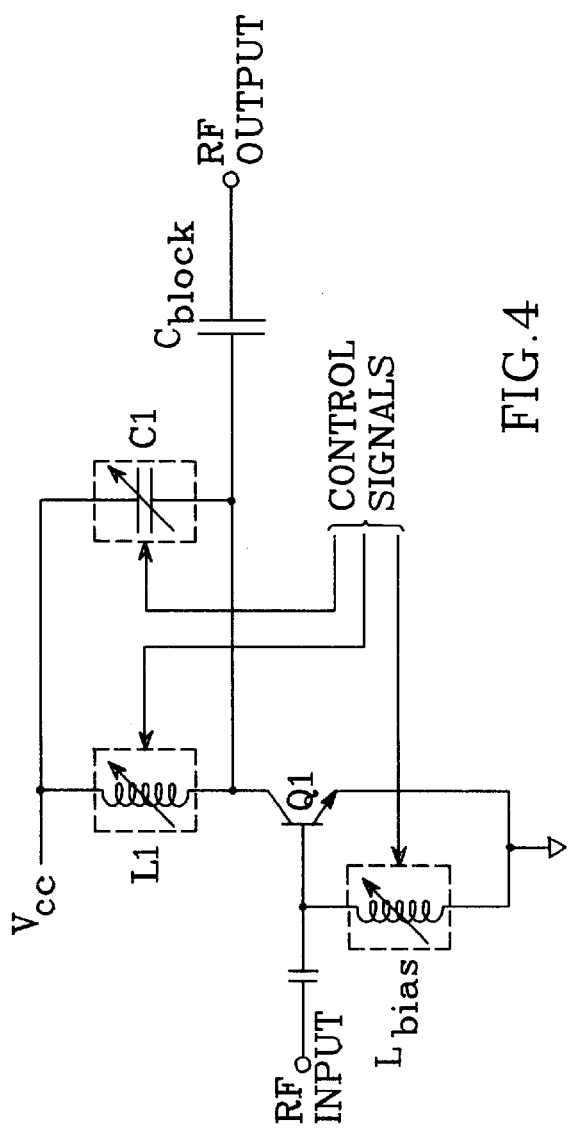
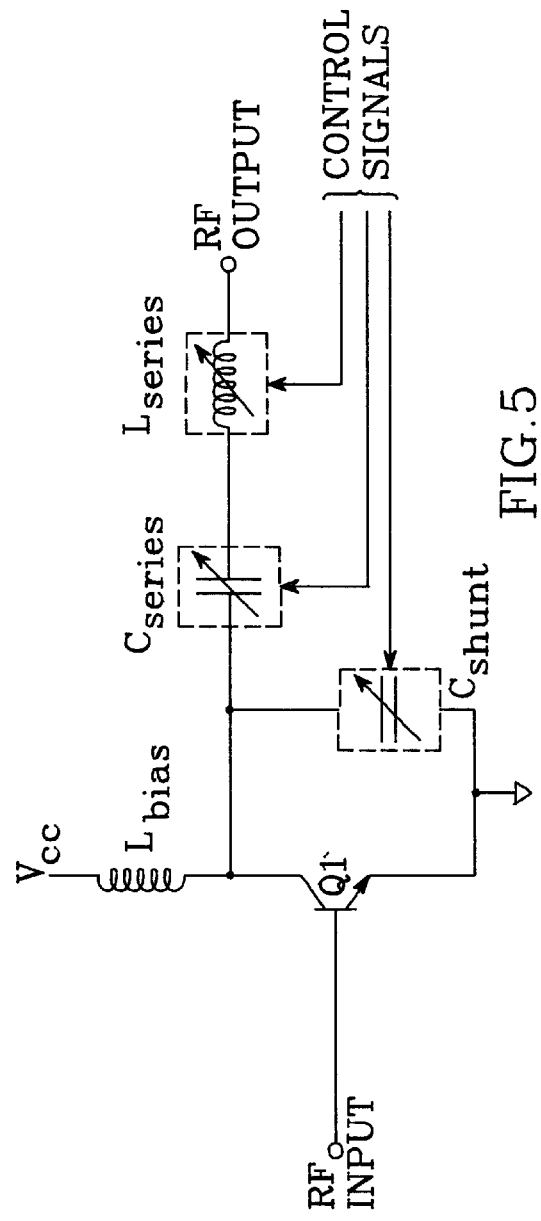
FIG.4
FIG.5

INTEGRATED TUNABLE HIGH EFFICIENCY POWER AMPLIFIER

BACKGROUND OF THE INVENTION

1. Field of the Invention

This invention relates to the field of tuned power amplifiers, particularly to tunable implementations of high efficiency switching power amplifiers.

2. Description of the Related Art

The demand for low-cost, reliable wireless communications continues to increase at a rapid rate, as do the demands on the technologies enabling such communications. Research is being conducted on many fronts to find ways to make the circuitry found inside devices such as cellular phones smaller, cheaper, easier to fabricate, less power-hungry, and more reliable.

A schematic diagram of a class E power amplifier is shown in FIG. 1. This type of amplifier is not commonly found in battery-powered communications devices in spite of its high efficiency, primarily because of its inherently narrow band nature. It has a theoretical efficiency of 100%, and actual efficiencies of better than 90% are routinely achieved. An RF input signal drives an active device 10, typically a transistor, which is operated as a switch. The transistor's current circuit is connected to drive a reactive load network 12 made up of a bias inductor $L_{bias}$ and a power source 14 connected in series and a shunt capacitor $C_{sh}$ connected across the transistor, and a series inductor $L_s$ and a series capacitor $C_s$ connected in series with the current circuit. The amplifier's RF output appears at $C_s$'s other terminal, shown driving a load $R_{load}$.

The class E amplifier shown is efficient only over a narrow frequency range centered around a specific operating frequency; i.e., it is inherently narrowband. The load network 12 is "tuned" to cause a particular phase relationship to exist at the operating frequency which allows the switching to occur at points of either zero voltage or zero current, leading to essentially lossless switching. The design equations used to achieve this condition are as described in U.S. Pat. No. 3,919,656 to Sokal et al.

There is a trade-off between the quality factor (Q) of the load network and the amplifier's bandwidth, with bandwidth being approximately inversely proportional to the network's Q. A very low Q yields an amplifier capable of high efficiencies over a wide bandwidth. However, a low Q also allows significantly higher amounts of harmonic currents to flow to the output load, so that the output requires additional filtering. Such filtering introduces additional losses, and requires additional reactive components which may have to be tuned to achieve acceptable performance Due to the need for additional output filtering with a low Q load network, a high Q network is preferred. The high Q load and the very low power at which switching occurs combine to keep harmonic content low, simplifying the output filtering. Unfortunately, a high Q load network makes the amplifier efficient over a narrow band of frequencies, and the requisite phase relationship between the load network and the input frequency deteriorates rapidly as the input moves away from the designed operating point.

Similar trade-offs must be made when designing amplifiers from other classes in which an active device drives a reactive load, such as classes C, C–E, and F, with the result being that these amplifiers typically end up being narrow-band. Though acceptable for use with inputs near the operating frequency, they are of little use where broad bandwidths, multiple frequencies, or frequency agility is a requirement, including most modern communications systems, both commercial and military.

Tunable inductors and/or capacitors are often incorporated into the design of a power amplifier, which are tuned by a technician to achieve acceptable performance when an amplifier is being assembled. This approach is not useful in a frequency hopping scheme, however, which requires the tuning of the load network to change in the field, to accommodate a change in operating frequency. Reactive components capable of being automatically tuned in the field exist, but either cannot be integrated with the other amplifier components, necessitating the use of hybrid or similar packaging schemes that increase size and weight while lowering efficiency and reliability, or provide low Q and a low efficiency amplifier. Reactive tuning elements are also problematic when designing a system for multiple frequency bands of operation, such as at 900 MHz and 1.9 GHz, or where extremely broad bandwidths are required In the prior art, such systems require lower Q matches, and suffer from reduced efficiency as a result.

SUMMARY OF THE INVENTION

Power amplifiers having reactive networks (classes C, C–E, E and F) are presented that offer both the high Q needed to keep output filtering to a minimum, and the frequency agility needed for broad bandwidth, multiple frequency bands of operation, or modern frequency hopping schemes.

Common to the various amplifier types realizable with the invention is the use of tunable reactive devices which are capable of being adjusted by means of respective control signals. The tunable reactive devices have high Q values across their adjustment range, enabling the amplifier to produce an output with a low harmonic content for a wider range of input signal frequencies than has previously been possible.

One type of tunable reactive device consists of high-Q fixed value components which are interconnected as necessary to provide a particular reactance. The switching needed to accomplish the interconnection is provided by micro-electromechanical (MEM) switches capable of providing low loss switching at RF frequencies, and of being integrated with the amplifier components on a common substrate. This approach can provide a very high Q reactive network at a number of discrete reactance steps. Alternatively, MEM devices having a continuously variable reactance value can be employed to provide the desired tunability. The novel amplifiers preferably include control circuits which generate the control signals needed to operate the MEM devices and thereby tune the amplifier.

In addition to offering a frequency agile, high quality output, the present invention enables an unprecedented degree of integration. The amplifier's active device, its tunable reactive devices, and the control circuitry which generates the necessary control signals to the MEM devices can all be integrated onto a common substrate, conserving space, reducing power consumption, and increasing reliability. The invention can be realized on a number of foundry technologies.

Further features and advantages of the invention will be apparent to those skilled in the art from the following detailed description, taken together with the accompanying drawings.

BRIEF DESCRIPTION OF THE DRAWINGS

FIG. 4 is a schematic diagram of a class C amplifier which includes a tunable reactive network per the present invention.

FIG. 5 is a schematic diagram of a class C–E amplifier which includes a tunable reactive network per the present invention

DETAILED DESCRIPTION OF THE INVENTION

Figure 1:
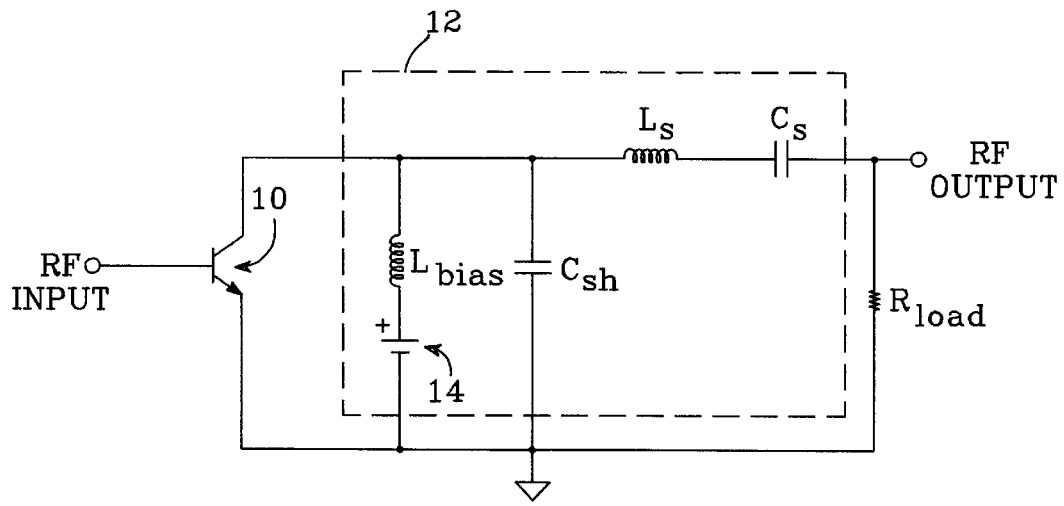
FIG. 1 is a block diagram of a prior art class E power amplifier.
Figure 2:
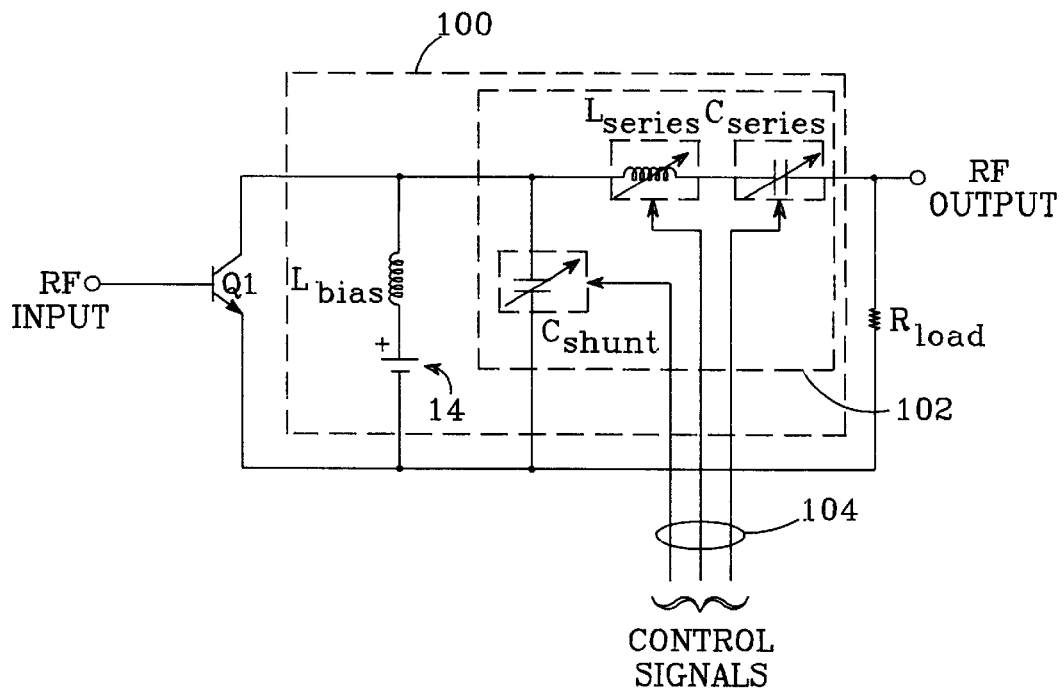
FIG. 2 is a schematic diagram of a class E amplifier which includes a tunable reactive network per the present invention.

A schematic diagram illustrating the principles of the invention is shown in FIG. 2. A class E amplifier is shown, but as discussed below, the invention is beneficially employed in amplifiers from other classes which include reactive networks that render them inherently narrowband. The topology of the FIG. 2 amplifier is similar to that shown in FIG. 1: an active device Q1, typically a transistor, is employed as a switch, turned on and off in response to an RF input signal applied to Q1's control input. Q1's current circuit drives a load network 100 which includes bias inductor $L_{bias}$ and power source 14 series-connected across Q1, as is a shunt capacitance $C_{shunt}$. A series inductance $L_{series}$ and series capacitance $C_{series}$ are also connected to Q1's current circuit; the amplifier's RF output appears at $C_{series}$ other terminal, which is connectable to drive a load $R_{load}$.

In contrast to the prior art circuit however, $C_{shunt}$, $L_{series}$ and $C_{series}$ are tunable reactive devices that form a tunable reactive network 102, with each of the devices connected to receive an electrical control signal 104. The reactance values of each of the tunable reactive devices are varied in accordance with their respective control signals. As noted above, the reactances found in the class E amplifier's load network establish the operating frequency around which the amplifier's efficiency is high. The invention enables the load network reactances to be varied by simply varying their respective control signals, which in turn varies the amplifier's operating frequency. Because these reactance adjustments are electrically controlled, they can be made while the amplifier is in use—outside the manufacturing environment—making the broad bandwidth, multiple frequency bands of operation, or modern frequency hopping communications systems possible.

The tunable reactive network is implemented with "micro-electromechanical (MEM)" devices. These devices include structures that can be physically moved in response to an electrical control signal. A tunable inductor which could be used to implement tunable series inductor $L_{series}$, for example, can consist of a bank of fixed inductors that are interconnected as necessary to provide a desired reactance with MEM switching devices An exemplary MEM tunable inductor of this type is described in U.S. Pat. No. 5,872,489 to Chang et al., assigned to the same assignee as the instant application and hereby incorporated by reference. As noted there, a variable inductance value is provided by appropriately operating the inductor's MEM switching devices. Use of such a tunable MEM inductor provides low-loss performance at high RF frequencies, eliminating the trade-offs that must be made when using a single fixed inductor, wherein a lower Q device must be employed to achieve a wider bandwidth. Because the inductance of the tunable MEM inductor is variable, each of its constituent fixed inductors can be high Q devices (discussed in more detail below), so that a high Q inductance is presented across the tunable inductor's full range. In this way, the benefits of a high Q reactive network—for example, low harmonic content and simplified output filtering—are retained, while still offering high efficiency performance across a wide bandwidth.

A tunable capacitor is similarly provided for use in the present invention using a bank of fixed capacitors that is interconnected as needed using MEM switching devices controlled by respective control signals. An exemplary MEM tunable capacitor of this type is described in U.S. Pat. No. 5,880,921 to Tham et al., assigned to the same assignee as the instant application and hereby incorporated by reference. Alternatively, a continuously variable MEM capacitor could be employed in the present amplifier's tunable reactive network. An exemplary MEM tunable capacitor of this type is described in co-pending patent application Ser. No. 09/004,679, TUNABLE-TRIMMABLE MICRO ELECTRO MECHANICAL SYSTEMS (MEMS) CAPACITOR, assigned to the same assignee as the instant application and hereby incorporated by reference. This device uses a master/slave structure to provide a capacitor that is continuously variable over a wide tuning range, Because this type of device does not employ fixed value components, the capacitance it provides may be known with somewhat less precision than the "bank" configuration described above, and its Q value may not be as high. However, depending on the specific application, its continuously variable tunability may compensate for these shortcomings.

Figure 3A:
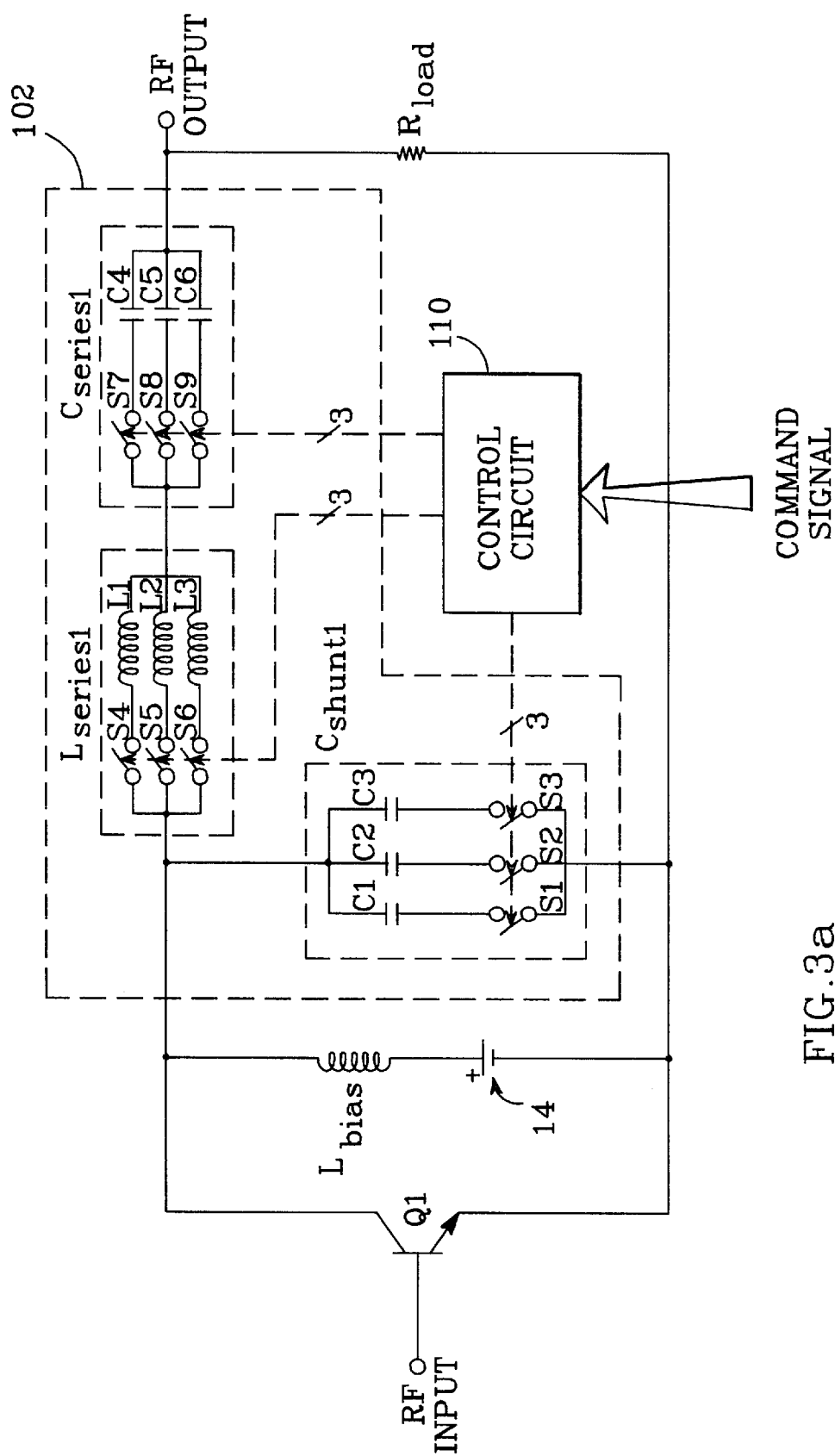
FIG. 3a is a schematic diagram of an embodiment of a class E amplifier with a tunable reactive network per the present invention

A class E amplifier employing the "bank" type of tunable reactive devices in tunable reactive network 102 is shown in FIG. 3a. Here, shunt capacitor $C_{shunt}$ is implemented with a tunable capacitor $C_{shunt1}$, which is made from three parallel fixed capacitors C1–C3 and three MEM switching devices S1–S3 connected to respective capacitors. This configuration allows $C_{shunt1}$ to assume one of eight discrete capacitance values, ranging from 0 (all switches open), to C1+C2+C3 (all switches closed). Each of switches S1–S3 is controlled by a respective independent control signal. The amplifier includes a control circuit 110, which generates the control signals needed to operate the switches. Control circuit 110 typically receives an external "command signal", which can be an analog voltage or current, a digital bit, or a digital word generated by a microprocessor, for example. The control circuit is arranged to respond to the command signal to open and close the MEM switches making up the tunable reactive devices as necessary to provide a desired reactance to active device Q1.

The series inductor $L_{series}$ of tunable reactive network 102 can be similarly implemented with a tunable inductor $L_{series1}$, made from three parallel inductors L1–L3 that are interconnected via respective MEM switches S4–S6. A desired series inductance is obtained by closing the appropriate switches, which are controlled by respective control signals generated by control circuit 110. This allows for seven values of $L_{series}$ to be selected instead of eight as for $C_{shunt1}$, because at least one value of $L_{series}$ must always be switched on. Series capacitor $C_{series}$ of tunable reactive network 102 is implemented in the same fashion, with a tunable capacitor $C_{series1}$ made from three parallel capacitors C4–C6 that are interconnected via respective MEM switches S7–S9, allowing seven values of $C_{series1}$ to be controlled by three control signals generated by control circuit 110.

The tunable reactive devices shown in FIG. 3a are merely illustrative. The fixed inductors and capacitors can be arranged in any number of series, parallel, and series-parallel configurations, with the resolution and reactance range needed for a particular application dictating the number and the configuration of the fixed components and switches.

Figure 3B:
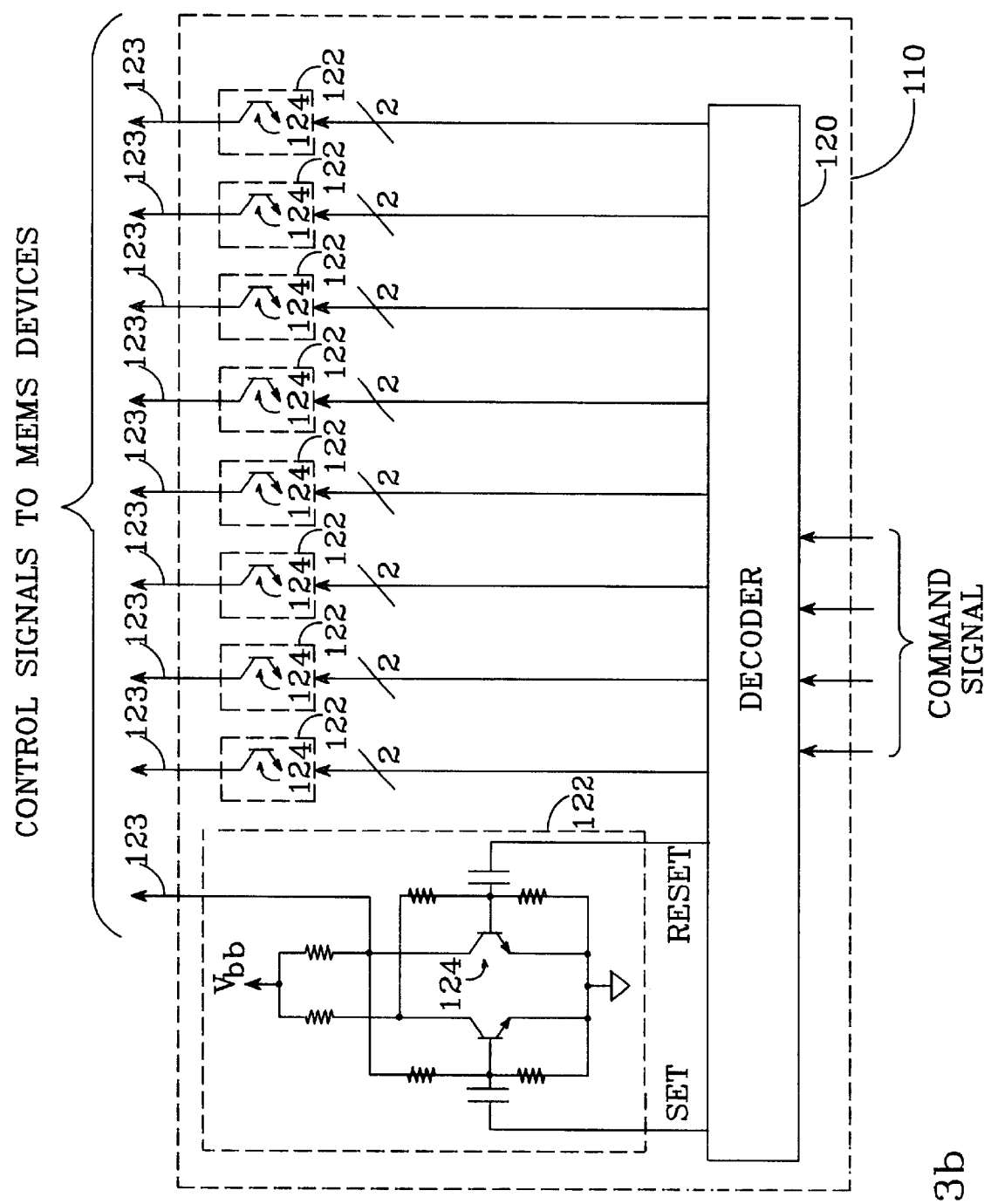
FIG. 3b is a schematic diagram of an exemplary control circuit for controlling a tunable reactive network per the present invention.

A schematic diagram of an exemplary control circuit 110 is shown in FIG. 3b. A 4-bit digital command signal is received by a decoder circuit 120, which decodes the command and provides set and reset signals to each of a number of S-R flip-flops 122, only one of which is shown in detail in FIG. 3b. Each of the flip-flops produces a control signal output 123, taken at the collector of one of the flip-flop's transistors 124; each control signal 123 is connected to control the state of a respective MEM switch The value of the command signal corresponds to a desired configuration of the amplifier's MEM devices. The decoder is arranged to set the control signals 123 as necessary to achieve a commanded configuration. Voltage $V_{bb}$ must be high enough to provide the actuation voltage necessary to operate the MEM switches.

Figure 3C:
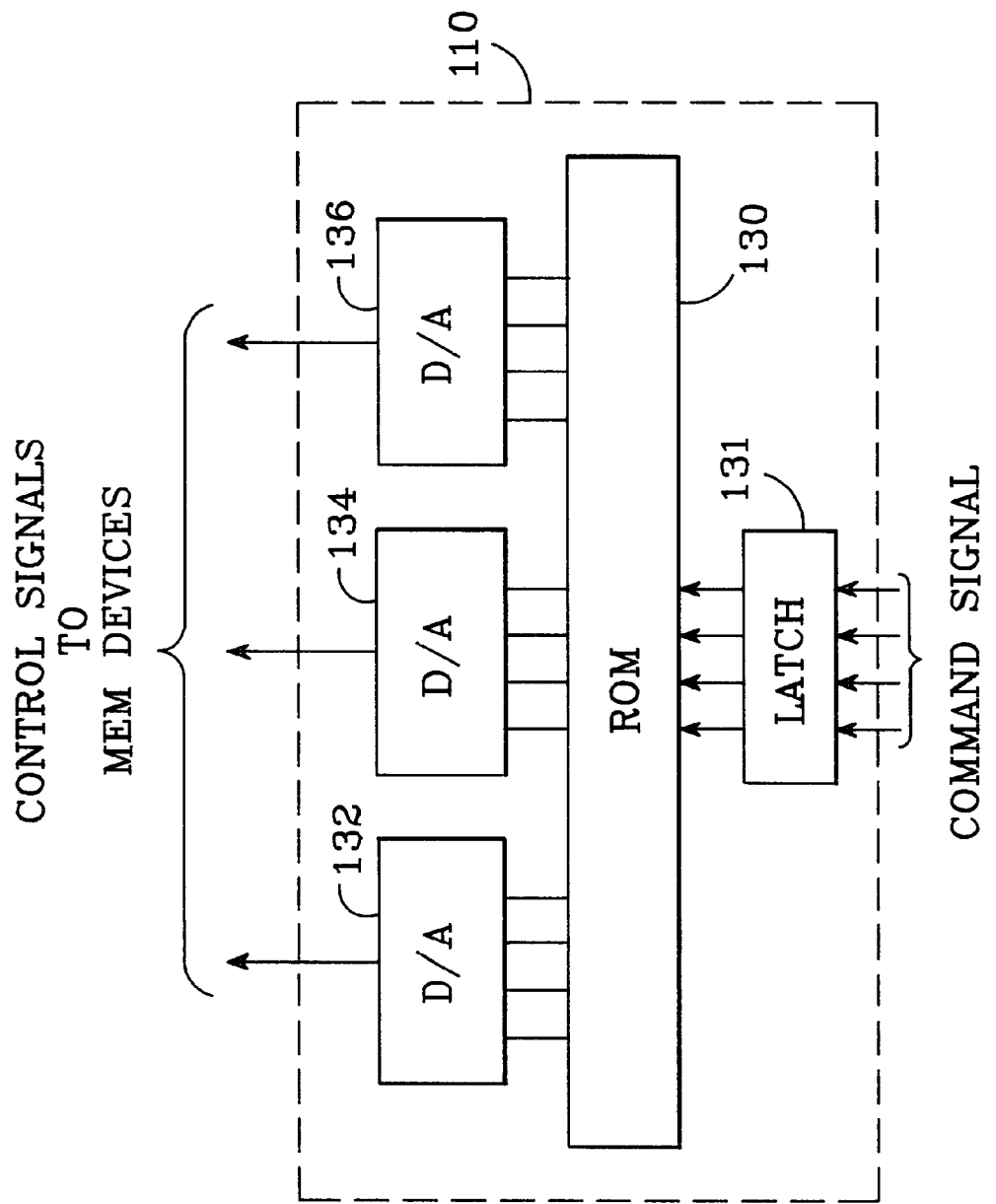
FIG. 3c is a block diagram of another exemplary control circuit for controlling a tunable reactive network per the present invention.

The control circuit 110 in FIG. 3b is given as an example only. Many other circuit configurations could be used to generate the individual control signals needed by the MEM devices For example, the number of bits making up the digital command signal could be increased to increase the number of selectable configurations, The control circuit 110 shown in FIG. 3b is arranged to generate control signals having only two states, but could alternately be arranged to generate analog control signal voltages, using digital-to-analog converters, for example, to control the continuously variable MEM capacitors described above, for example. Such a control circuit is shown in FIG. 3c. Here, a command signal is latched and applied to a ROM 130 by a latch circuit 131. Four-bit groups of output bits from ROM 130 are connected to respective digital-to-analog (D/A) converters 132, 134 and 136. The outputs of the D/A converters are connected to control respective continuously variable MEM devices, the reactance of which varies with its D/A output voltage.

The invention is employed in class C and class C–E amplifiers in FIGS. 4 and 5, respectively. In FIG. 4's class C amplifier, a parallel tuned circuit is placed in the current circuit of active device Q1; the tuned circuit includes a tunable inductor L1 and a tunable capacitor C1, both of which employ MEM devices as described above. For a class C amplifier, Q1 has a conduction angle of less than 180°, and the circuit reactances supply a flywheel effect to create the remainder of the waveform when Q1 is cut off by the RF input. L1 and C1 provide the energy storage needed to convert the current spikes produced when Q1 conducts to a complete output waveform. However, a parallel tuned circuit is inherently narrow band. The invention enables both L1 and C1 to be tunable, thus allowing the amplifier to operate efficiently over a much wider bandwidth.

A capacitor $C_{block}$ is connected between Q1's current circuit and the amplifier's output. This capacitor serves only as a DC block, and thus need not be tunable. An inductor $L_{bias}$ is connected to Q1's control input and serves as a biasing component. Biasing components are typically fairly insensitive to frequency and need not be tunable. However, there may be an advantage to making $L_{bias}$ tunable if it is to be used as provide impedance matching as well as bias, and the amplifier's desired bandwidth is large. If so, $L_{bias}$ is implemented with MEM devices as described above.

FIG. 5's class C–E amplifier is similar to the class E amplifier of FIG. 2, with the series capacitor $C_{series}$ and series inductor $L_{series}$ interchanged, and the bias inductor $L_{bias}$ moved into Q1's current circuit. $L_{bias}$ is preferably a large, fixed value suitable for biasing the amplifier, while $C_{series}$, $L_{series}$, and $C_{shunt}$ are each made tunable using MEM devices, as discussed in connection with FIG. 2 above.

Figure 6:
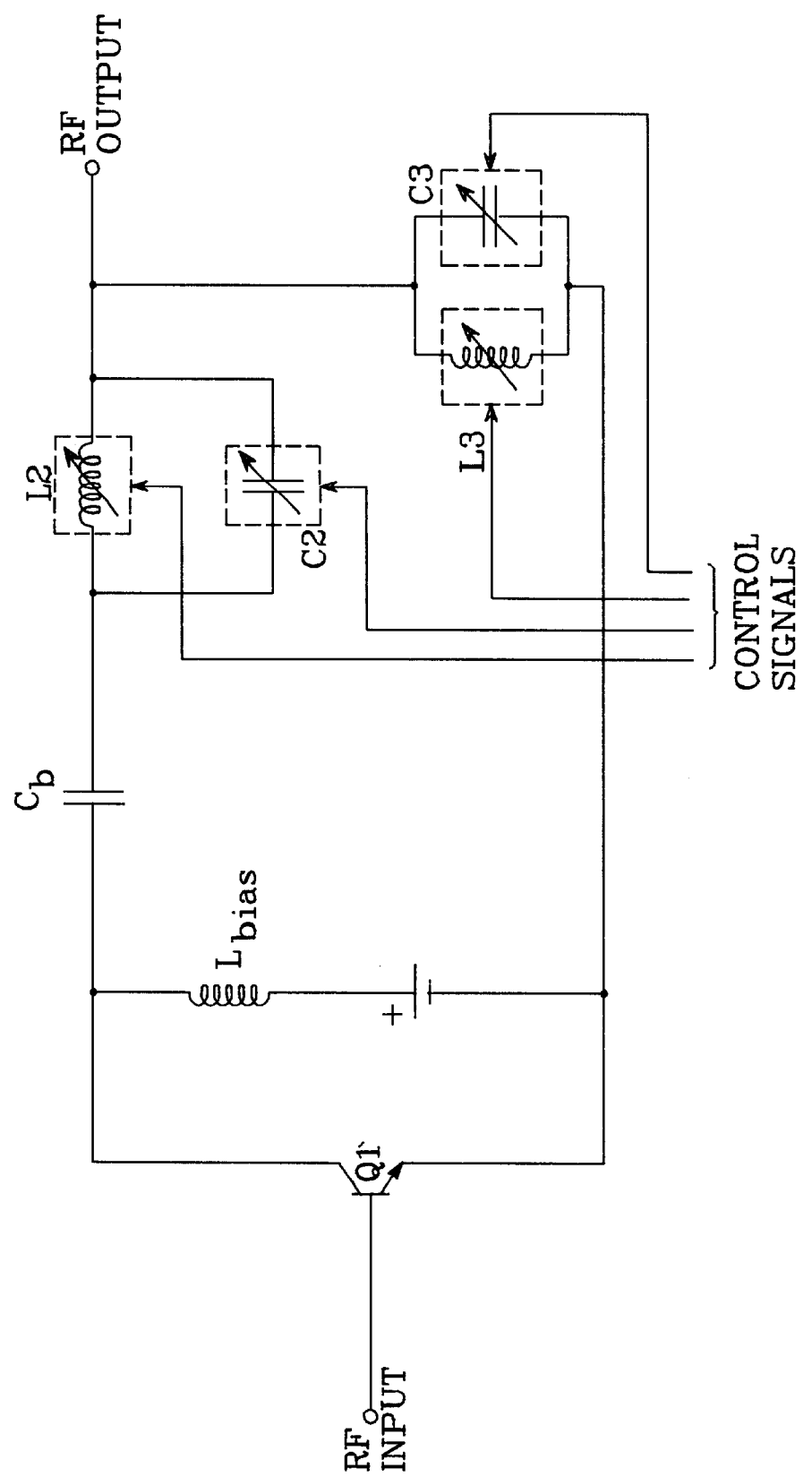
FIG. 6 is a schematic diagram of a class F amplifier which includes a tunable reactive network per the present invention.

An class F amplifier is shown in FIG. 6, with its inherent narrowband performance overcome with the use of MEM-based tunable reactive devices. Class F amplifiers are derived from class C amplifiers by adding parallel resonant circuit(s) in series with the output, tuned to one or more harmonics of the desired signal to prevent current flow at the undesired harmonics. FIG. 6 depicts a third harmonic peaking circuit, which includes two tank circuits: the first tank circuit includes a tunable inductor L2 and a tunable capacitor C2 connected between the output of Q1 and the RF output, and the second tank includes a tunable inductor L3 and a tunable capacitor C3 connected across Q1. Because of the necessity of having tuned circuits in the output, the amplifier would normally be narrowband. Using tunable reactive devices L2, L3, C2 and C3, each of which receives an independent control signal, the amplifier is made broadband. Biasing inductor $L_{bias}$, connected across Q1, and capacitor $C_b$, connected in series with Q1's output, are preferably fixed value components.

Each of the tunable reactive devices uqed in the amplifiers discussed above receives an independent control signal from a control circuit (not shown), such as that discussed in connection with FIG. 3b. The control circuit provides independent, coordinated control of all the tunable reactances, enabling the normally narrowband amplifiers to operate efficiently over a wide range of input frequencies.

Of course, not all of the reactive devices depicted as tunable in the discussion of the amplifier classes above need be tunable. An amplifier per the present invention requires at least one tunable reactive device in order that its benefits be realized, but others of the reactive devices may be fixed value components. This is likely to reduce the range of reactances which can be electrically selected, but may reduce the size required by the amplifier and simplify its fabrication.

A major advantage of an amplifier per the present invention is the integrability of its tunable reactive devices with the other amplifier components (discussed in detail below).

The MEM devices can be fabricated on the same substrate with the amplifier's active device(s), its fixed value capacitors, inductors and resistors, and even the control circuit that generates control signals for the tunable components. This unprecedented level of integration provides both lower cost and higher reliability when compared with prior art hybrid or discrete solutions used to provide tunability.

One possible fabrication sequence illustrating the integration of a portion of a tunable high efficiency power amplifier is depicted in FIGS. 7a–14a (plan views) and 7b–14b (corresponding cross-sectional views). The fabrication sequence shown is based on a representative dportion of the amplifier of FIG. 3a: it includes one tunable reactive device $L_{series1}$ (made from three MEM switches and three fixed inductors), the amplifier's active device Q1, and the three transistors of control circuit 110 which provide the control signals needed to operate the three MEM switches. Note that a complete tunable power amplifier per the present invention would include a number of other tunable reactive devices, passive components, and control circuit components. For purposes of clarity, these other components are not shown, but the fabrication techniques described below would be used to provide them as well.

The sequence shown in FIGS. 7–14 begins after the amplifier's active devices have been fabricated, per standard techniques well-known in the field of I.C. fabrication. FIG. 7a thus includes transistor Q1, representing the amplifier's already fabricated active device, and transistors 124, representing three transistors from control circuit 110.

Figure 7B:
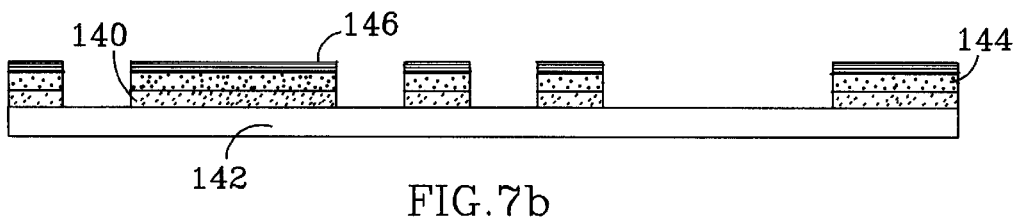
FIGS. 7b, 8b, 9b, 10b, 11b, 12b, 13b, and 14b are cross-sectional views which correspond with FIGS. 7a–14a, respectively, showing a fabrication sequence for integrating the components of a tunable power amplifier per the present invention on a common substrate.
Figure 7A:
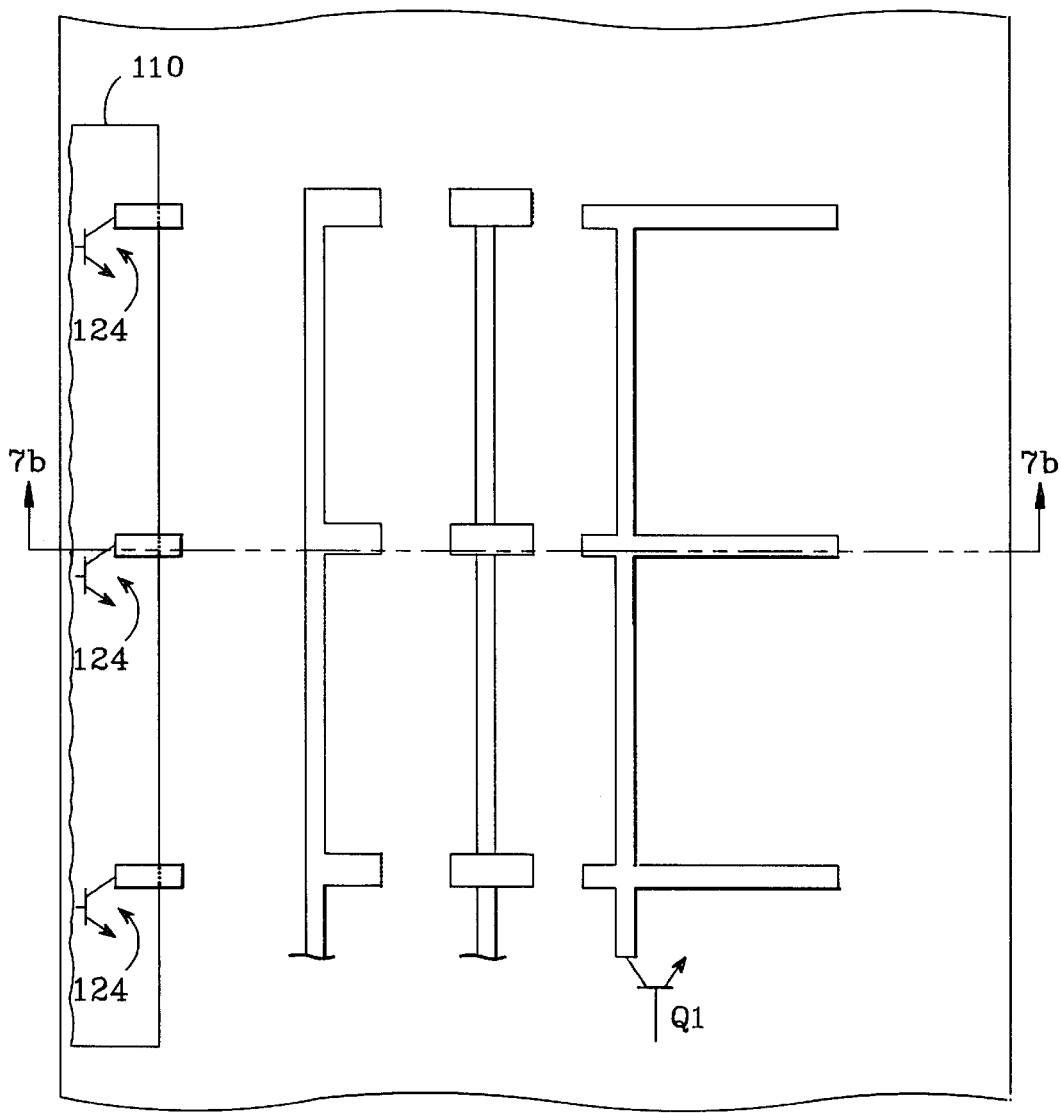
FIGS. 7a, 8a, 9a, 10a, 11a, 12a, 13a, and 14a are plan views showing a fabrication sequence for integrating the components of a tunable power amplifier per the present invention on a common substrate

In FIG. 7b (layers not shown in FIG. 7a), a first sacrificial material 140, such as a layer of thermal setting polyimide, is deposited on a substrate 142. A second sacrificial layer, such as a layer of pre-imidized polyimide 144 that can be selectively removed from the first sacrificial layer, is then deposited. A layer of silicon nitride 146, preferably about 1500 Å thick, is then deposited and patterned using photolithography and reactive ion etching (RIE) in $CHF_3$ and $O_2$ chemistry. The pattern is transferred to the underlying polyimide layers using $O_2$ RIE, resulting in the plan view shown in FIG. 7a and the cross-section shown in FIG. 7b. This creates a "lift-off" profile compatible with the selective deposition of metal into the distinct open areas The tunable reactive devices depicted in this fabrication sequence use MEM switches to selectively interconnect a network of inductors to obtain a desired reactance value. A MEM switch as described herein each has a top electrode positioned on a cantilever arm which extends over a bottom electrode positioned on substrate When an actuation voltage is applied across the top and bottom electrodes, the cantilever arm is electrostatically drawn toward the substrate and a contact electrode affixed to the substrate side of the cantilever arm bridges a gapped signal line on the substrate surface, creating a continuous signal path. An SPST switch function is performed by controllably bridging and opening the gap between signal lines. MEM switches as described herein are discussed in Yao and Chang, "A Surface Micromachined Miniature Switch for Telecommunications Applications with Signal Frequencies from DC up to 4 GHz," In Tech. Digest (1995), pp. 384–387 and in U.S. Pat. No. 5,578,976 to Yao, which is assigned to the same assignee as the present application.

Figure 8B:
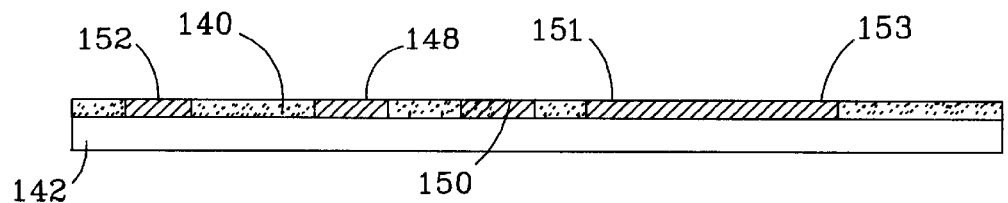
Figure 8A:
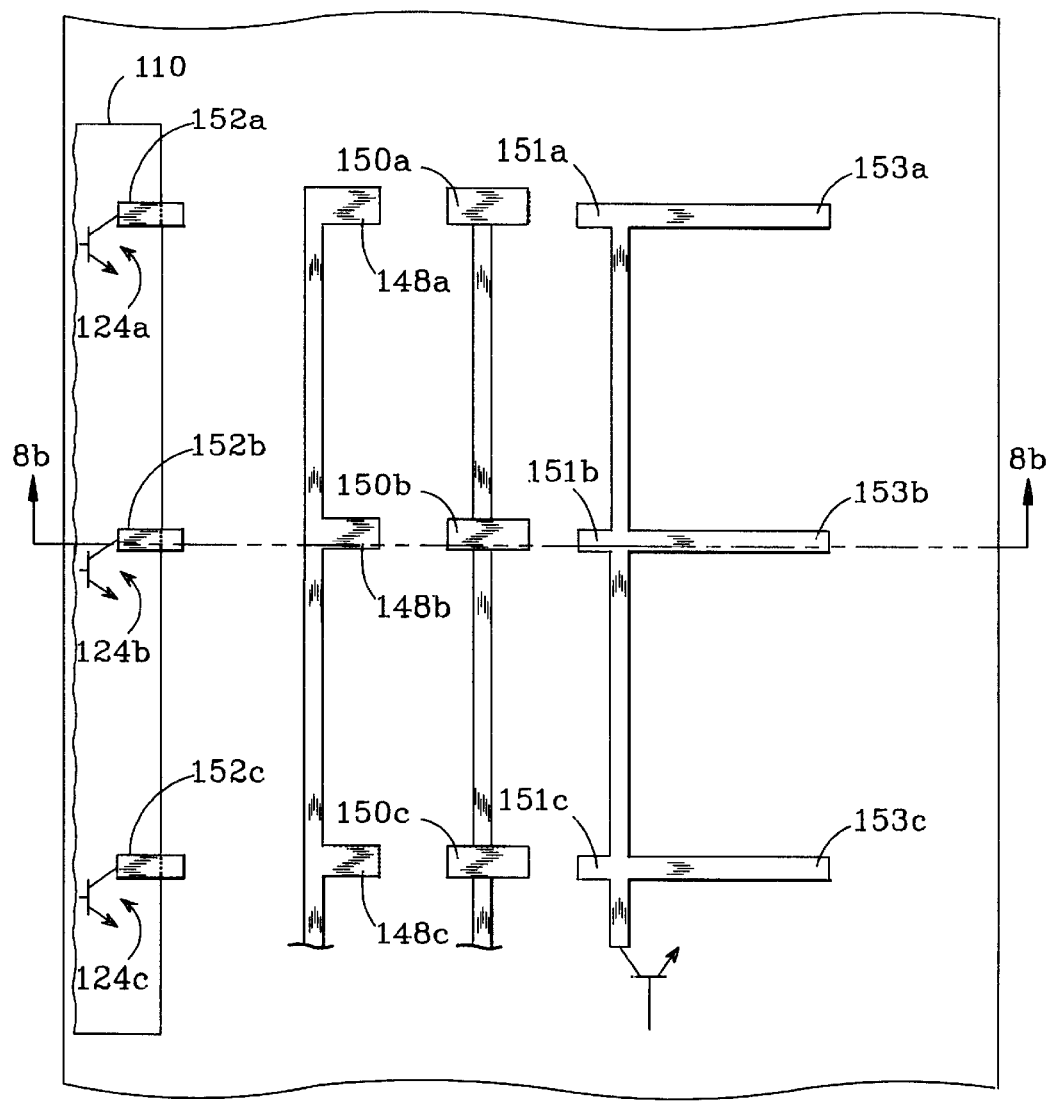
Figure 9B:
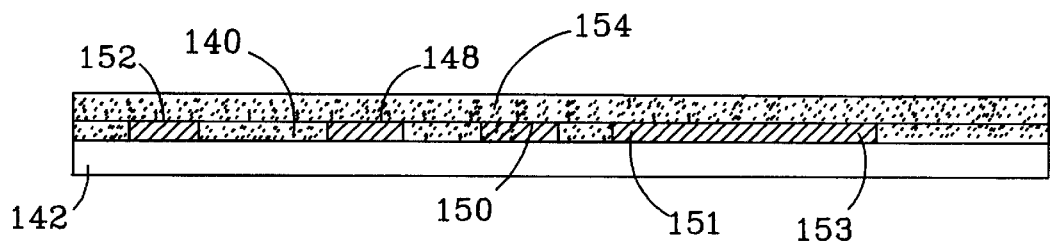
Figure 9A:
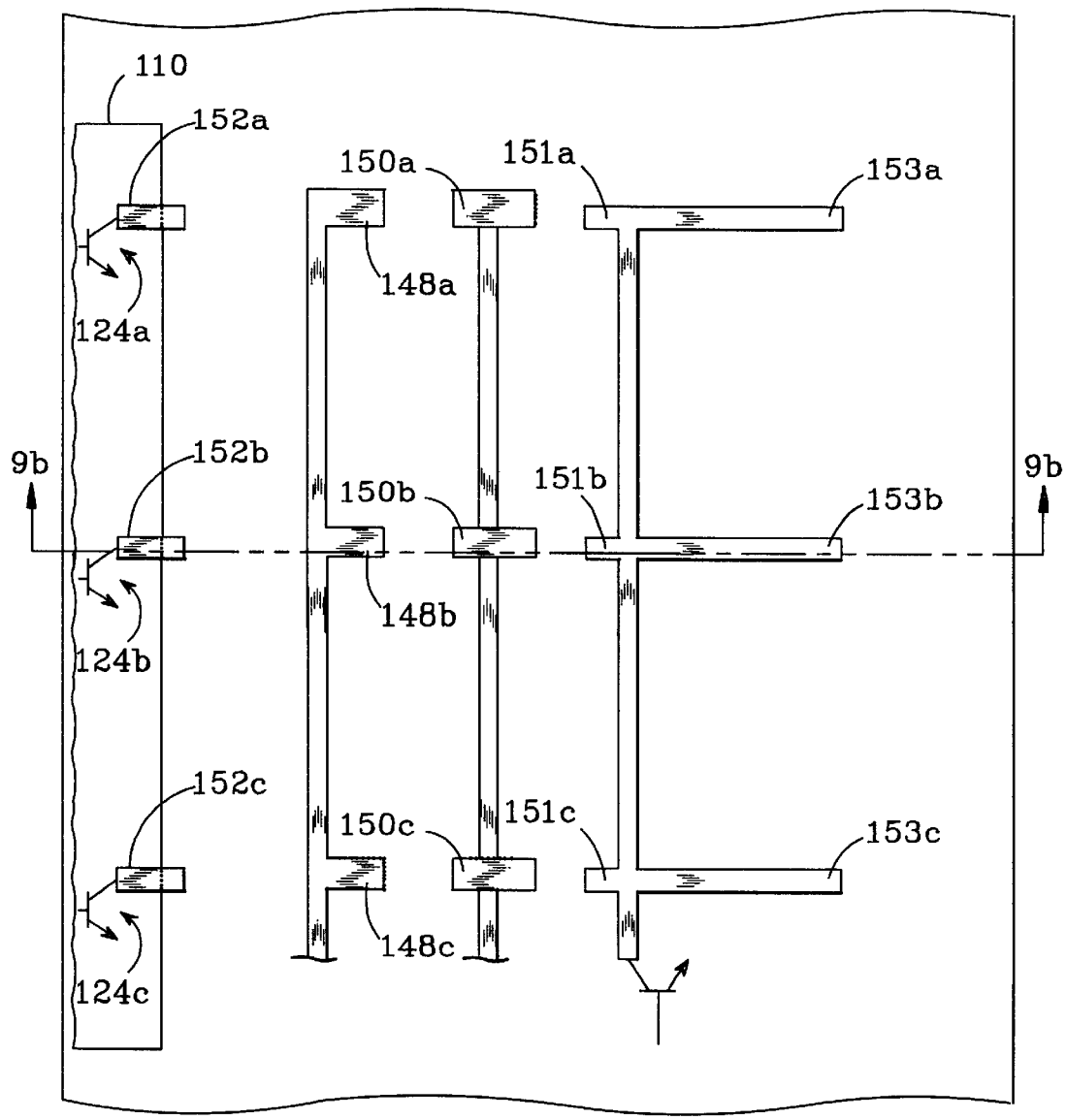

In FIGS. 8a and 8b, a layer of metal is deposited, preferably by electron beam evaporation, which is about equal in thickness to the first sacrificial layer 140. The second sacrificial layer 144, the silicon nitride layer 146 and the metal on top of it are then dissolved away in a solution such a methylene chloride, retaining the metal in the original open areas along with the first sacrificial layer 140. This first metal layer defines the bottom electrodes 148a, 148b and 148c of the three MEM switches (S4, S5, S6) and the traces which interconnect the bottom electrodes; the pairs of metal traces 150a/151a, 150b/151b and 150c/151c which form the switches' respective gapped signal lines that are bridged when their respective switch is actuated, and the traces interconnecting appropriate signal lines; and the metal traces 152a, 152b and 152c that will interconnect the three control circuit transistors 124 to the top electrodes of MEM switches S4, S5 and S6, respectively. The ends of traces 151 which are not adjacent to traces 150 form the center taps 153a, 153b and 153c of what will become fixed inductors L1, L2 and L3 of tunable reactive device $L_{series1}$.

Figure 10B:
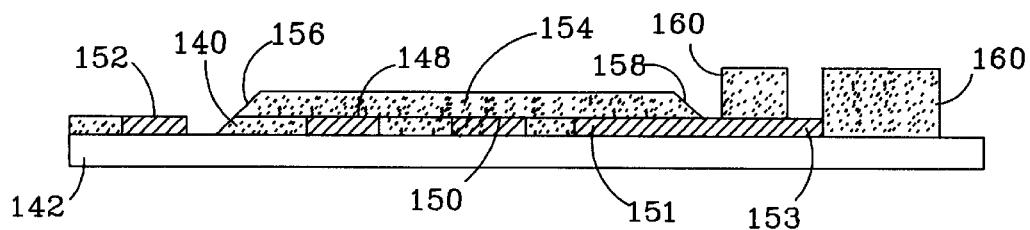
Figure 10A:
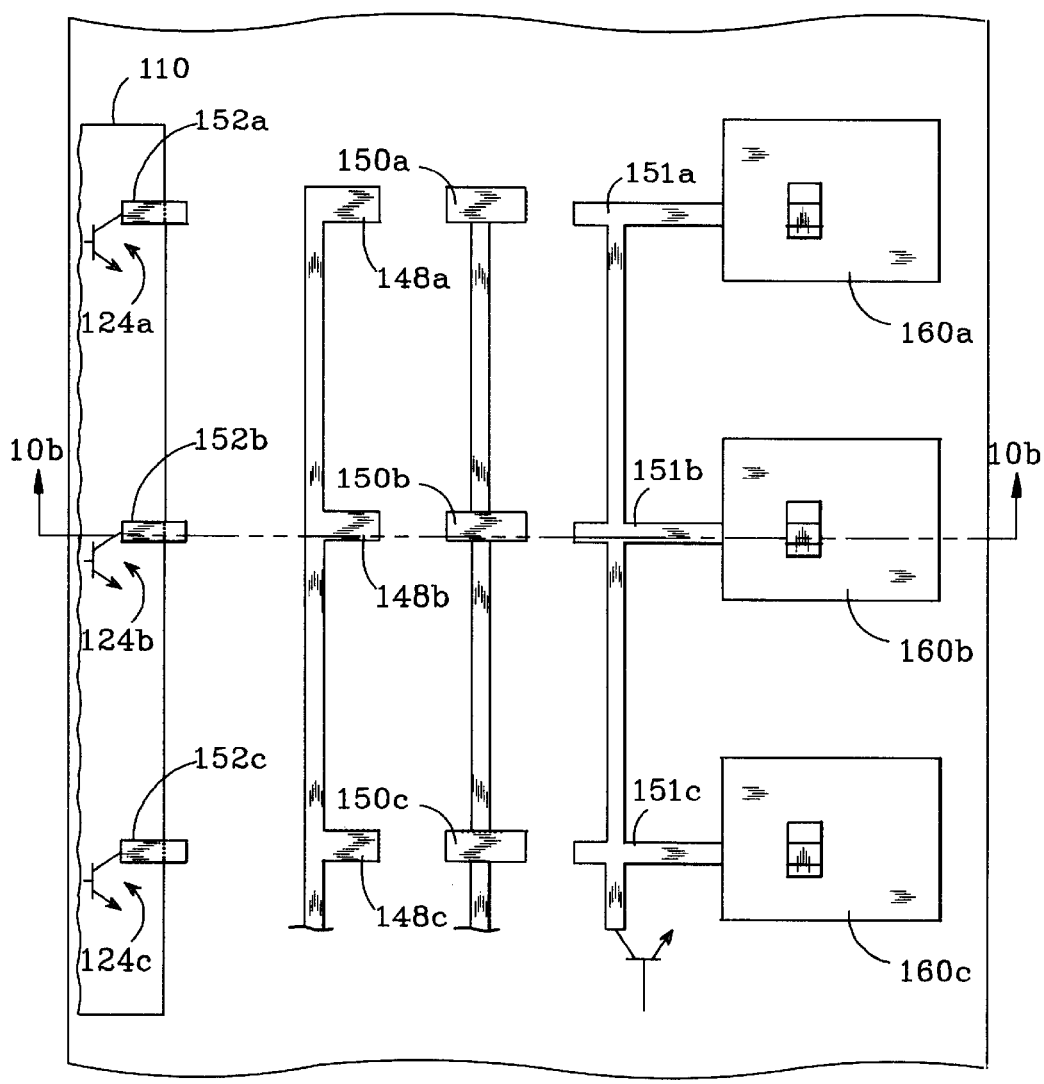

Next, an additional sacrificial polyimide layer 154 is deposited (FIG. 9b, not shown in FIG. 9a) and patterned to form the switches' sloping sidewalls 156 and 158 using $O_2$ RIE (FIG. 10b, not shown in FIG. 10a), and a selective deposition of a thick insulating material, preferably silicon dioxide, forms support posts 162a, 160b and 160c for the inductor coils (FIGS. 10a and 10b).

Figure 11B:
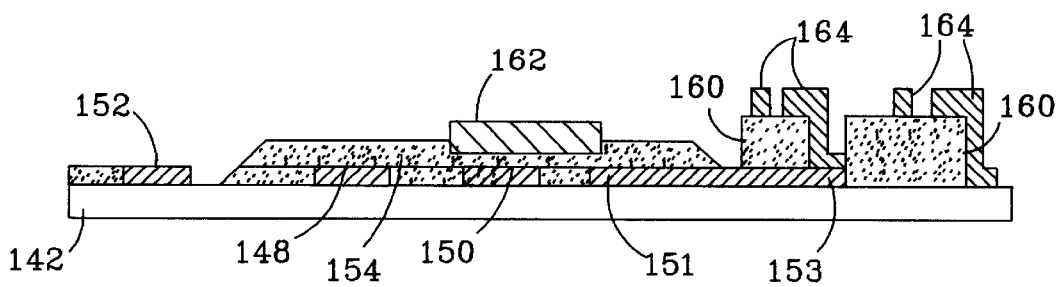
Figure 11A:
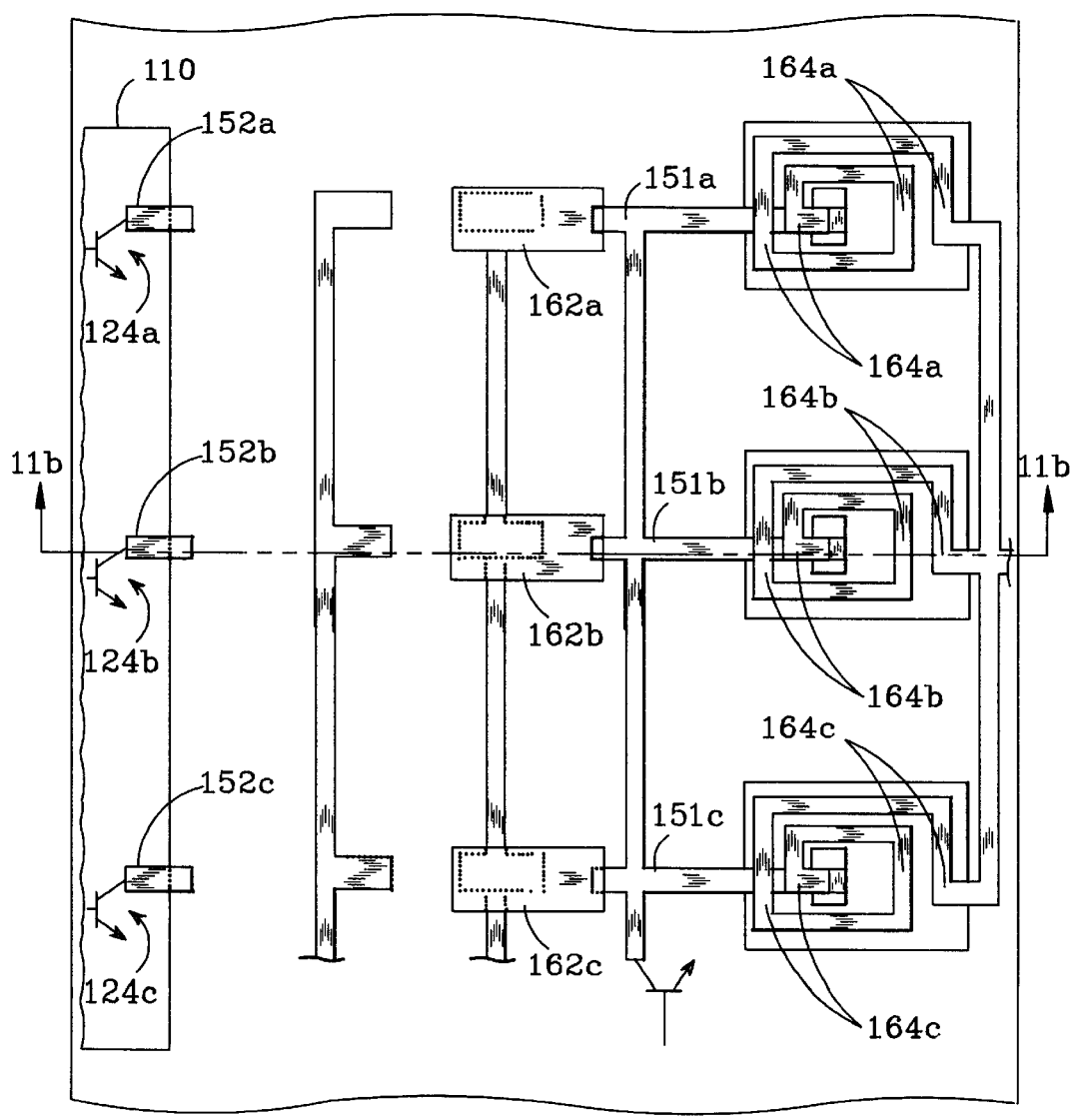

As shown in FIGS. 11a and 11b, another layer of metal is deposited and patterned to form the switches' contact electrodes 162a, 162b and 162c and the inductor coils 162a, 164b and 164c (orthogonal portions of the coils not shown in FIG. 11b for clarity). This metal layer also interconnects the "output" terminals of the inductors (i.e., the terminals opposite those connected to the MEM switches); this junction of the three inductors is connected to following circuitry (such as $C_{series1}$ in FIG. 3a), which is not shown. For reasons discussed below, the areas where the contact electrodes 162 will reside are preferably treated in an $O_2$ RIE plasma to etch a small amount, preferably 2000 Å–5000 Å, into the topmost sacrificial layer 154, so that the electrodes are slightly recessed into the layer.

Figure 12B:
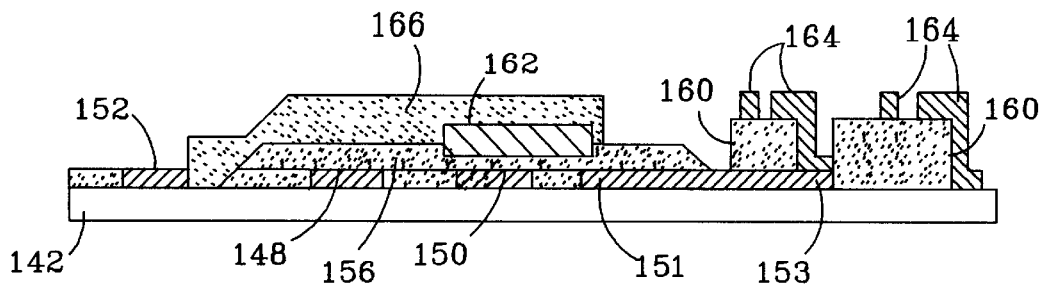
Figure 12A:
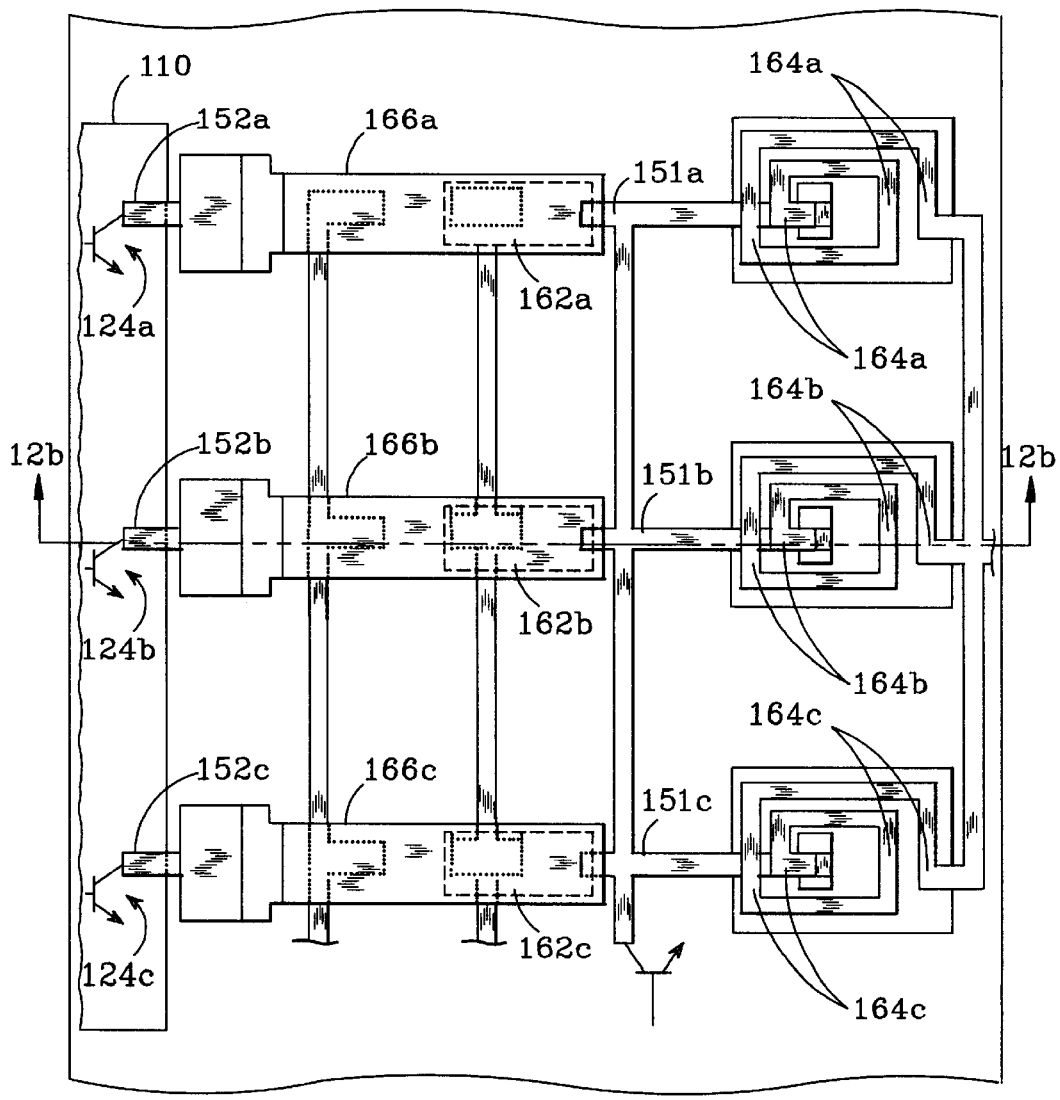
Figure 13B:
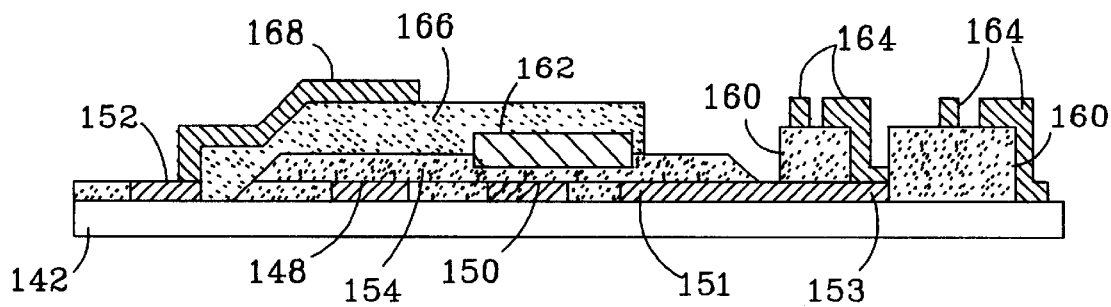
Figure 13A:
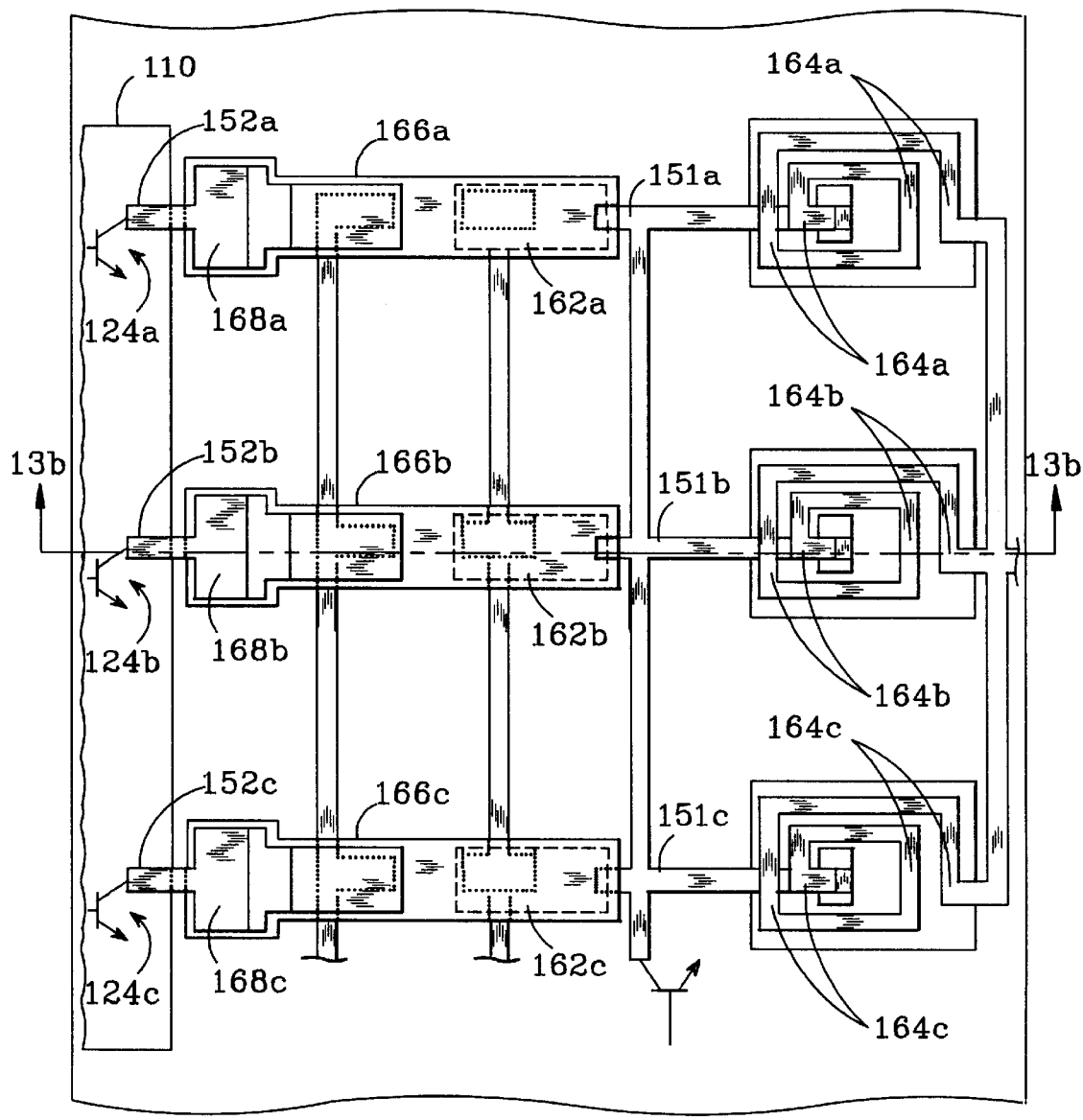

In FIGS. 12a and 12b, cantilever arms 166a, 166b and 166c are formed from a layer, preferably about 2 μm thick, of PECVD silicon dioxide, patterned and etched with $CHF_3$ and $O_2$ RIE. In FIGS. 13a and 13b, a layer of metal, preferably aluminum about 2500 Å thick, is deposited, preferably using electron beam evaporation and lift-off, to form top electrodes 168a, 168b and 168c for the three MEM switches. The top electrodes 168 extend over their respective bottom electrodes 148, come down the slope of cantilever arms 166 to the rear of the arms, and connect to the traces 152 which are in turn connected to control circuit transistors 124. Thus, when a switch's corresponding transistor 124 is turned off, a voltage (V+) is applied to the switch's top electrode 168 via its respective trace 152 to actuate the switch.

Figure 14B:
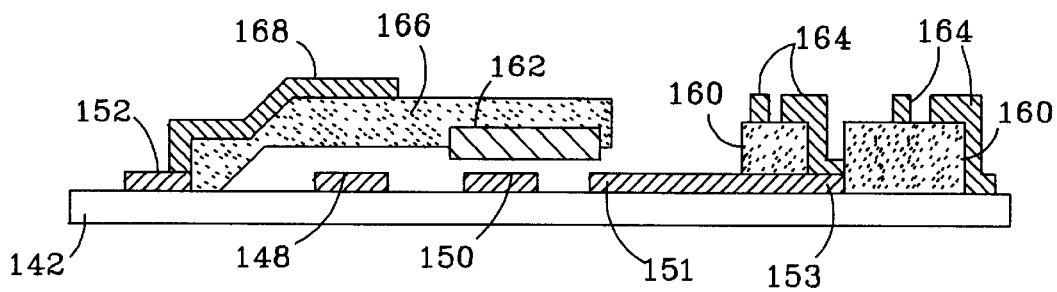
Figure 14A:
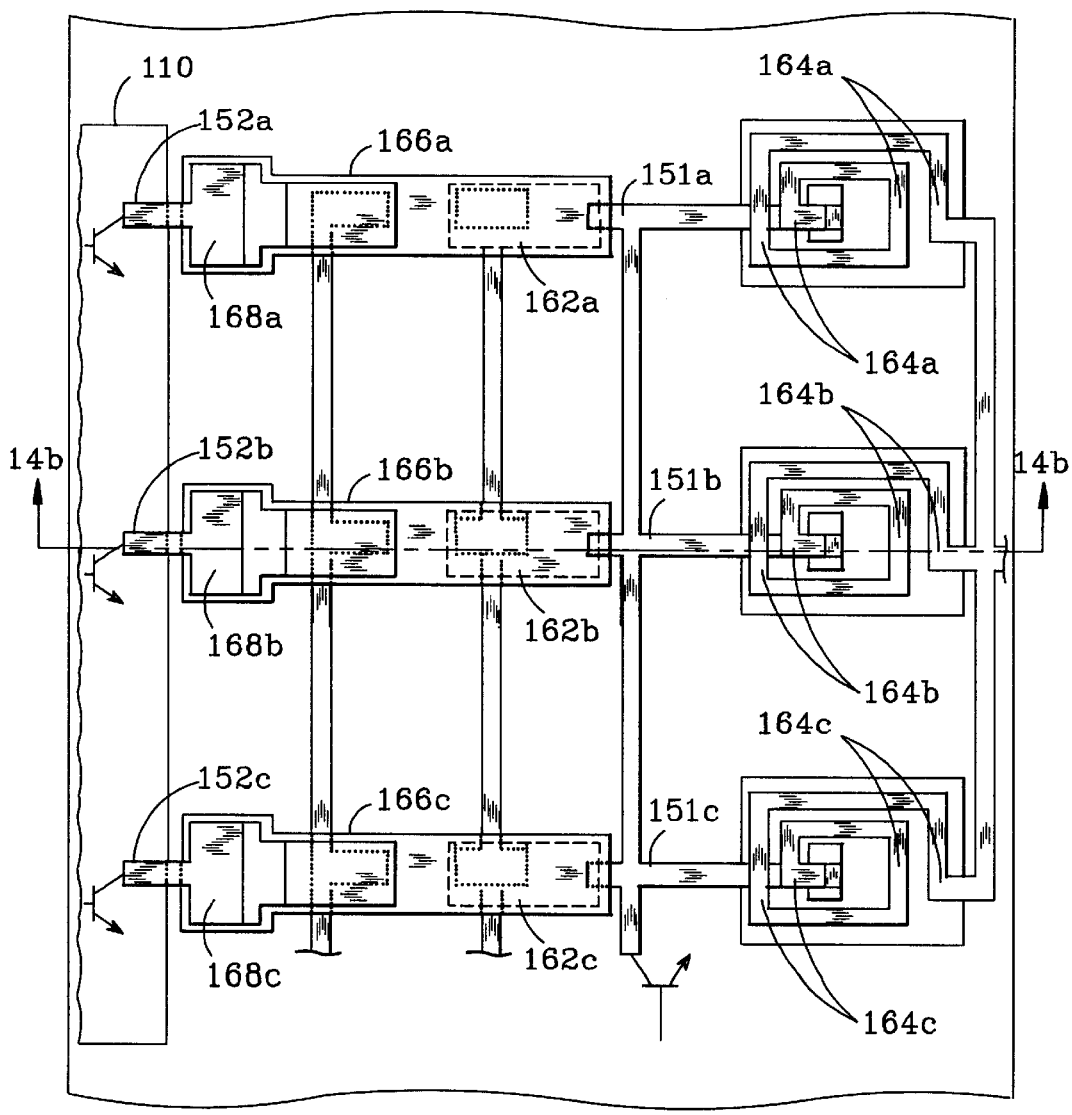

In FIGS. 14a and 14b, the sacrificial layers are removed, preferably with an unpatterned $O_2$ etch using a Branson $O_2$ barrel etcher, to remove all remaining polyimide layers on the substrate surface, including those under the cantilever arms 166. This allows the arms 166 to flex downward in response to an actuation voltage applied across their respective top electrodes leg and bottom electrodes 148, causing contact electrodes 162 to bridge the gap between traces 150 and 151. When configured as shown, closing a MEM switch adds its respective inductor to the tunable device's reactive network, while opening a switch disconnects its inductor from the network.

As mentioned above, top electrodes 162 are preferably slightly recessed into sacrificial layer 154. This is to ensure that when a switch is actuated, its contact electrode 162 bridges traces 150, 151 before its cantilever arm comes into contact with its bottom electrode 148.

The substrate 142 is not limited to any particular material, and is properly chosen based on other system considerations. For example, a glass substrate is inexpensive, allows large inductors to be formed on it, and reduces parasitic capacitance between the inductors and the substrate. Silicon or GaAs substrates may be preferable, however, if the tunable reactive devices are being integrated with other components which require one of those substrate materials. The power amplifiers found in wireless communications devices, for example, often use high-speed active devices which must be fabricated on a semi-insulating GaAs substrate. An amplifier utilizing tunable reactive devices as described herein could integrate its active device(s) and its tunable reactive network on a common GaAs substrate.

The metal which forms the inductor coils is preferably made as thick as possible, to reduce their resistance and to increase the inductor's Q. As noted above, high Q reactive devices are preferred because they offer an amplifier low harmonic content and simplified output filtering. However, the switches' contact electrodes 162 are formed with the same deposition step as the coils and may become too heavy if made too thick, so that a compromise is necessary between coil thickness and contact thickness. The necessity of making this compromise can be avoided if an alternative fabrication sequence is followed in which the inductors are fabricated on the substrate first, without simultaneously building up the switches. When the inductor fabrication is complete, the sequence picks up with the deposition of the polyimide layers 140 and 144 and the silicon nitride layer 146 as shown in FIG. 7b. These layers serve to protect the inductors while the switches are built up; all the protective layers are removed when the unpatterned $O_2$ RIE etch step is performed as shown in FIG. 14b. This method requires more processing steps to be executed, but allows for a more flexible choice of inductor design parameters. For example, this approach permits the metal of the inductor coils to be thicker than that of the contact electrode, lowering the resistance of the coils and raising the inductor's Q. Fabrication of integrated inductors is discussed, for example, in C. T. Wang, *Introduction to Semiconductor Technology*, John Wiley & Sons (1990), pp. 422–433.

The fabrication sequence shown in FIGS. 7–14 shows the inductors elevated above the substrate by support posts 160. This arrangement is preferred because it reduces parasitic capacitance between the inductor coils and the substrate 142. Alternatively, the coils can be fabricated directly on an insulating substrate, with the center tap brought out over the coils via the use of air bridges.

The invention can be practiced on any kind of material on which active devices can be fabricated, including gallium arsenide and silicon, for example. As such, it is useful with many types of active devices and fabrication processes, including CMOS, BiCMOS, BJT, HBT, HEMT, PHEMT and MESFET, for example.

Fabrication of CMOS or bipolar active devices is performed per well-known CMOS or bipolar fabrication techniques, as are discussed, for example, in A. Grebene, *Bipolar and MOS Analog Integrated Circuit Design*, John Wiley & Sons (1984), pp. 54–120. Fabrication on a GaAs substrate is performed per well-known GaAs fabrication techniques, as are discussed, for example, in C. Wang, *Introduction to Semiconductor Technology: GaAs and Related Compounds*, John Wiley & Sons (1990), pp. 123–133 and 187–195.

Though the fabrication sequence depicted herein employ MEM switches to provide tunability, the invention is similarly realizable using continuously variable MEM devices as discussed in the co-pending patent application (Ser. No. 09/004,679) cited above. The fabrication process described there also enables an unprecedented level of integration, enabling MEM-based continuously variable capacitors to be integrated with an amplifier's active device(s) and other components to provide a tunable high efficiency power amplifier per the present invention. The control circuit needed to tune such an amplifier would typically include D/A converters (as shown in FIG. 3c), which could also be integrated with the amplifier components on a common substrate.

The fabrication methods used to create the MEM switch contacts discussed above produce metal features which are thicker than those made with standard thin-film processing. This characteristic of MEM fabrication methods also benefits the other simultaneously fabricated inductors and/or capacitors that make up an amplifier. The additional thickness of the metal features built up on substrate 142 produces thicker inductor coils, which lowers their resistance and raises the inductor's Q value. While standard thin-film processing produces metal layers on the order of 1 $\mu$m thick, features produced using MEM techniques may be 10–100 $\mu$m thick or more. Similarly, increasing the thickness of a capacitor's plates reduces their losses and improves their performance. Thus, the invention enables the integration of a high efficiency tunable power amplifier to an unprecedented degree, without sacrificing amplifier performance. The invention further enables power amplifiers built as described herein to offer both the high Q needed to keep output filtering to a minimum, and the frequency agility needed for broad bandwidth, multiple frequency bands of operation, or modern frequency hopping schemes.

The tunable reactive device based on switched combinations of fixed inductors or capacitors can include more or less fixed-value reactive components than have been discussed herein, and the fixed-value components can be arranged in series, parallel, or any series-parallel combination. The number and configuration of the reactive components and switches is determined by the application's requirements, such as the inductance or capacitance range and resolution needed Discrete tunable reactive devices could also be used to provide tunability for a high efficiency power amplifier, but because such discrete components cannot be integrated, the advantages gained with the high level of integration provided by the invention would be somewhat sacrificed.

As stated above, the device fabrication shown in FIGS. 7–14 is merely illustrative. Active devices, inductors, capacitors, resistors and switches are fabricated and interconnected together on a common substrate as needed to implement a tunable power amplifier having desired performance characteristics.

This invention is not limited to the specific power amplifier classes discussed herein; other applications to networks associated with active gain stages will be obvious to those skilled in the art, such as low noise amplifiers, where the optimum noise match of a device may limit its potential bandwidth of operation, and use of the principles of the instant application will extend the usable bandwidth. Application to oscillators, active filters and other networks where the Q of the reactive components forms a limitation to current art can benefit from these principles.

While particular embodiments of the invention have been shown and described, numerous variations and alternate embodiments will occur to those skilled in the art. Accordingly, it is intended that the invention be limited only in terms of the appended claims.

We claim:

1. A tunable high efficiency power amplifier, comprising:
   an active device connected to receive an RF input signal at a control input and having a current circuit which is switched between conductive and non-conductive states in accordance with said RF input signal, and
   a network of reactive devices connected to said current circuit, said active device and said network forming a power amplifier arranged to amplify said RF input signal over a range of input signal frequencies determined by the values of said reactive devices, said reactive devices comprising:
      at least one inductance, and
      at least one capacitance,
   at least one of said at least one inductance and at least one of said at least one capacitance being tunable reactive devices, each of which comprises at least one microelectromechanical (MEM) device that operates in response to a respective control signal and that varies its respective tunable reactive device's reactance value in accordance with said control signal such that said range of input signal frequencies over which said amplifier is operational is varied in accordance with said control signals, thereby enabling said amplifier to operate efficiently over a wider range of input frequencies.

2. The tunable amplifier of claim 1, wherein said active device and said network of reactive devices are integrated together on a common substrate.

3. The tunable amplifier of claim 1, wherein each of said tunable reactive devices has a high Q value over its full range of reactance values.

4. The tunable amplifier of claim 1, wherein said tunable reactive devices each comprise:
   at least two fixed value reactive components, and
   at least one MEM switch that opens and closes in response to said control signal, said at least one switch and said fixed value components interconnected to form a network having an input and an output such that the reactance value between said input and output varies in accordance with the state of said at least one switch.

5. The tunable amplifier of claim 4, wherein each of said fixed value reactive components has a high Q value such that a high Q reactive network is presented to said active device regardless of the network's reactance value set by the state of said at least one switch.

6. The tunable amplifier of claim 1, wherein said at least one tunable reactive device is a tunable capacitor comprising a MEM device having first and second terminals and arranged to continuously vary the capacitance value between said first and second terminals in accordance with the value of said control signal.

7. The tunable amplifier of claim 6, wherein said tunable capacitor has a high Q value such that a high Q reactive network is presented to said active device across the range of capacitance values obtainable with said control signal.

8. A tunable high efficiency power amplifier, comprising:
   an active device connected to receive an RF input signal at a control input and having a current circuit which is switched between conductive and non-conductive states in accordance with said RF input signal,
   a network of reactive devices connected to said current circuit, said active device and said network forming a power amplifier arranged to amplify said RF input signal over a range of input signal frequencies determined by the values of said reactive devices, said reactive devices comprising:
      at least one inductance, and
      at least one capacitance,
   at least one of said at least one capacitances being a tunable capacitor comprising at least one microelectromechanical (MEM) device having first and second terminals, said tunable capacitor arranged to continuously vary the capacitance value between said first and second terminals in accordance with the value of a control signal such that said range of input signal frequencies over which said amplifier is operational is varied in accordance with said control signal, thereby enabling said amplifier to operate efficiently over a wider range of input frequencies, and
   a control circuit arranged to provide said control signal to said tunable capacitor and thereby establish its capacitance, said control circuit including a digital-to-analog (D/A) converter which produces said control signal in response to a digital command signal.

9. The tunable amplifier of claim 1, further comprising a control circuit arranged to provide said control signals to respective MEM devices and thereby establish the reactance values of each of said tunable reactive devices.

10. The tunable amplifier of claim 9, wherein said active device, said network of reactive devices and said control circuit are integrated together on a common substrate.

11. The tunable amplifier of claim 9, wherein said control circuit automatically provides said control signals in response to a command signal.

12. A tunable class E power amplifier, comprising:
   an active device connected to receive an RF input signal at a control input and having a current circuit which is switched between conductive and non-conductive states in accordance with said RF input signal,
   a bias inductor connected to said current circuit,
   a network of reactive devices connected to said current circuit, said active device, said bias inductor and said network of reactive devices forming a class E power amplifier arranged to amplify said Rf input signal over a range of input signal frequencies determined by the values of said reactive devices, said reactive devices comprising:
      a shunt capacitor,
      a series inductor, and
      a series capacitor,
   at least two of said shunt capacitor, said series inductor and said series capacitor being tunable reactive devices, each of which comprises at least one microelectromechanical (MEM) device that operates in response to a respective control signal and that varies its respective tunable reactive device's reactance value in accordance with said control signal such that said range of input signal frequencies over which said amplifier is operational is varied in accordance with said control signals, thereby enabling said amplifier to operate efficiently over a wider range of input frequencies, and
   a control circuit arranged to provide said control signals to each of said at least two MEM devices and thereby establish the reactance value of each MEM device's respective tunable reactive device.

13. The tunable class E power amplifier of claim 12, wherein said active device, said bias inductor, said network of reactive devices and said control circuit are integrated together on a common substrate.

14. The tunable class E power amplifier of claim 12, wherein each of said shunt capacitor, said series inductor, and said series capacitor are said tunable reactive devices.

15. The tunable class E power amplifier of claim 12, wherein said control circuit automatically provides said control signals in response to a command signal.

16. A tunable class C power amplifier, comprising:
an active device connected to receive an RF input signal at a control input and having a current circuit which is switched between conductive and non-conductive states in accordance with said RF input signal,
a bias inductor connected to said control input of said active device,
a blocking capacitor connected to said current circuit,
a network of reactive devices connected to said current circuit, said active device, said bias inductor, said blocking capacitor and said network of reactive devices forming a class C power amplifier arranged to amplify said RF input signal over a range of input signal frequencies determined by the values of said reactive devices, said reactive devices arranged in a parallel tuned circuit which is connected to said current circuit and comprising:
a capacitor, and
an inductor,
at least one of said capacitor and said inductor connected in said parallel tuned circuit being a tunable reactive device comprising at least one micro-electromechanical (MEM) device that operates in response to a respective control signal and that varies its respective tunable reactive device's reactance value in accordance with said control signal such that said range of input signal frequencies over which said amplifier is operational is varied in accordance with said control signal, thereby enabling said amplifier to operate efficiently over a wider range of input frequencies, and
a control circuit arranged to provide said control signals to each of said at least one MEM device and thereby establish the reactance value of each MEM device's respective tunable reactive device.

17. The tunable class C power amplifier of claim 16, wherein said active device, said bias inductor, said blocking capacitor, said network of reactive devices and said control circuit are integrated together on a common substrate.

18. The tunable class C power amplifier of claim 16, wherein each of said capacitor and said inductor connected in said parallel tuned circuit are said tunable reactive devices.

19. The tunable class C power amplifier of claim 16, wherein said control circuit automatically provides said control signals in response to a command signal.

20. The tunable class C power amplifier of claim 16, wherein said bias inductor is a tunable reactive device comprising at least one micro-electromechanical (MEM) device that operates in response to a control signal and that varies said bias inductor's inductance value in accordance with said control signal.

21. A tunable class C–E power amplifier, comprising:
an active device connected to receive an RF input signal at a control input and having a current circuit which is switched between conductive and non-conductive states in accordance with said RF input signal,
a bias inductor connected to said current circuit,
a network of reactive devices connected to said current circuit, said active device, said bias inductor and said network of reactive devices forming a class C–E power amplifier arranged to amplify said Rf input signal over a range of input signal frequencies determined by the values of said reactive devices, said reactive devices comprising:
a shunt capacitor,
a series inductor, and
a series capacitor,
at least two of said shunt capacitor, said series inductor and said series capacitor being tunable reactive devices, each of which comprises at least one micro-electromechanical (MEM) device that operates in response to a respective control signal and that varies its respective tunable reactive device's reactance value in accordance with said control signal such that said range of input signal frequencies over which said amplifier is operational is varied in accordance with said control signals, thereby enabling said amplifier to operate efficiently over a wider range of input frequencies, and
a control circuit arranged to provide said control signals to each of said at least one MEM devices and thereby establish the reactance value of each MEM device's respective tunable reactive device.

22. The tunable class C–E power amplifier of claim 21, wherein said active device, said bias inductor, said network of reactive devices and said control circuit are integrated together on a common substrate.

23. The tunable class C–E power amplifier of claim 21, wherein each of said shunt capacitor, said series inductor, and said series capacitor are said tunable reactive devices.

24. A tunable class F power amplifier, comprising:
an active device connected to receive an RF input signal at a control input and having a current circuit which is switched between conductive and non-conductive states in accordance with said RF input signal,
a bias inductor connected to said current circuit,
a capacitor connected in series with said current circuit,
a network of reactive devices connected to said current circuit, said active device, said bias inductor, said capacitor and said network of reactive devices forming a class F power amplifier arranged to amplify said RF input signal over a range of input signal frequencies determined by the values of said reactive devices and to produce said amplified RF input signal at an output, said reactive devices arranged in one or more parallel tuned circuits connected to said output, each of said parallel tuned circuits comprising:
a capacitor, and
an inductor,
said capacitor and said inductor connected in said parallel tuned circuit being tunable reactive devices, each of which comprises at least one micro-electromechanical (MEM) device that operates in response to a respective control signal and that varies its respective tunable reactive device's reactance value in accordance with said control signal such that said range of input signal frequencies over which said amplifier is operational is.

25. The tunable class F power amplifier of claim 24 wherein said active device, said bias inductor, said capacitor, said network of reactive devices and said control circuit are integrated together on a common substrate.

26. The tunable class E power amplifier of claim 24, wherein each of said capacitors and said inductors connected in said parallel tuned circuits are said tunable reactive devices.

* * * * *